United States Patent
Kim

(10) Patent No.: US 7,030,684 B2
(45) Date of Patent: Apr. 18, 2006

(54) HIGH VOLTAGE SWITCH CIRCUIT OF SEMICONDUCTOR DEVICE

(75) Inventor: Doe Cook Kim, Chungcheongbuk-Do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 35 days.

(21) Appl. No.: 10/876,144

(22) Filed: Jun. 24, 2004

(65) Prior Publication Data

US 2005/0077951 A1    Apr. 14, 2005

(30) Foreign Application Priority Data

Oct. 10, 2003    (KR) ...................... 10-2003-0070557

(51) Int. Cl.
  *G05F 1/10*    (2006.01)
  *G05F 3/02*    (2006.01)
(52) U.S. Cl. ...................... 327/536; 327/390
(58) Field of Classification Search ........ 327/536–537, 327/289, 390, 589; 365/185.33, 185.27
See application file for complete search history.

(56) References Cited

U.S. PATENT DOCUMENTS

| | | | | |
|---|---|---|---|---|
| 5,760,497 A | * | 6/1998 | Pascucci | 307/110 |
| 5,767,729 A | * | 6/1998 | Song | 327/390 |
| 5,784,326 A | * | 7/1998 | Wu et al. | 365/185.19 |
| 6,828,849 B1 | * | 12/2004 | Nakamura | 327/536 |
| 6,909,640 B1 | * | 6/2005 | Jeong | 365/185.33 |
| 6,930,536 B1 | * | 8/2005 | Nazarian et al. | 327/536 |

* cited by examiner

*Primary Examiner*—Dinh T. Le
(74) *Attorney, Agent, or Firm*—Marshall, Gerstein & Borun LLP

(57) ABSTRACT

The present invention discloses a high voltage switch circuit of a semiconductor device which can efficiently switch a high voltage over about 20V required in a flash memory even in a low voltage below about 1.4V by reducing increase of a threshold voltage by a back bias, facilitate development of a low voltage memory device, and reduce an area of a pumping capacitor.

5 Claims, 1 Drawing Sheet

HIGH VOLTAGE SWITCH CIRCUIT OF SEMICONDUCTOR DEVICE

This application relies for priority upon Korean Patent Application No. 2003-0070557 filed on Oct. 10, 2003, the contents of which are herein incorporated by reference in their entirety.

BACKGROUND

1. Field of the Invention

The present invention relates to a high voltage switch circuit of a semiconductor device, and more particularly to, a high voltage switch circuit of a semiconductor device which can efficiently switch a high voltage in a low voltage.

2. Discussion of Related Art

In general, a semiconductor device requires a pumping voltage higher than an input power voltage, and also requires a high voltage switch for switching the high voltage.

FIG. 1 is a circuit diagram illustrating a conventional high voltage switch circuit.

Referring to FIG. 1, the conventional high voltage switch circuit includes a NAND gate NG1 for outputting a pumping clock signal P_CLK according to an external enable signal EN and a clock signal CLK, a pumping unit 10 for outputting a pumping voltage Vpump according to an external first high voltage Vpp and the pumping clock signal P_CLK, a precharge unit 20 for precharging the output from the pumping unit 10 according to the enable signal EN, and a switch unit 30 for switching a second high voltage Vin according to the pumping voltage Vpump of the pumping unit 10.

The pumping unit 10 includes a first capacitor C1 coupled between a pumping clock signal input terminal and an output terminal of the pumping unit 10, an inverter 11 and a second capacitor C2 connected in series between the pumping clock signal input terminal and a first node Q1, a native first transistor T1 coupled between the first node Q1 and the output terminal of the pumping unit 10 and driven according to the first node Q1, and a second transistor T2 coupled between the first node Q1 and an external high voltage input terminal and driven according to the output terminal of the pumping unit 10.

The precharge unit 20 includes a third transistor T3 coupled between an enable signal input terminal and the output terminal of the pumping unit 10 and driven according to a power supply voltage Vcc. The switch unit 30 includes a fourth transistor T4 coupled between a second high voltage input terminal Vin and a second high voltage output terminal Vout and driven according to the output from the pumping unit 10.

The operation of the conventional high voltage switch circuit will now be explained.

When the enable signal EN has a logic high level, the output terminal of the pumping unit 10 is precharged by the third transistor T3. Here, the output value from the NAND gate NG1 is varied by the clock signal CLK, and inverted by the inverter 11. The pumping voltage Vpump is generated through a positive feedback loop comprised of the first and second capacitors C1 and C2 and the first and second transistors T1 and T2. However, threshold voltages of the first and second transistors T1 and T2 causing a voltage loss of the positive feedback loop are increased due to a back bias voltage in the conventional high voltage switch circuit, so that there is a problem that the conventional high voltage switch circuit is not appropriately operated in a low voltage of below 2.5 V.

SUMMARY OF THE INVENTION

The present invention is directed to a high voltage switch circuit of a semiconductor device which can efficiently switch a high voltage by reducing loss of a positive feedback loop by a back bias, by forming a pumping unit with a native transistor and a transistor having a triple well and using an external control transistor.

One aspect of the present invention is to provide a high voltage switch circuit of a semiconductor device, including: an input unit for outputting a pumping clock signal by logically combining a clock signal and an enable signal; a pumping unit for outputting a pumping voltage signal according to a first high voltage and the pumping clock signal, wherein the pumping unit includes a first and a second native transistors connected the first high voltage; and a switch unit for switching a second high voltage according to the pumping voltage.

Preferably, the pumping unit further includes: a first capacitor for pumping a voltage of the pumping clock signal to the output from the pumping unit; an inverter for inverting the pumping clock signal; a second capacitor for pumping a voltage of the inverted pumping clock signal to a first node; and a first transistor formed on a well for supplying a voltage of the first node to an output terminal of the pumping unit according to a voltage level of the first node.

Preferably, the input unit includes a NAND gate for receiving the clock signal and the enable signal.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

Figure 1:
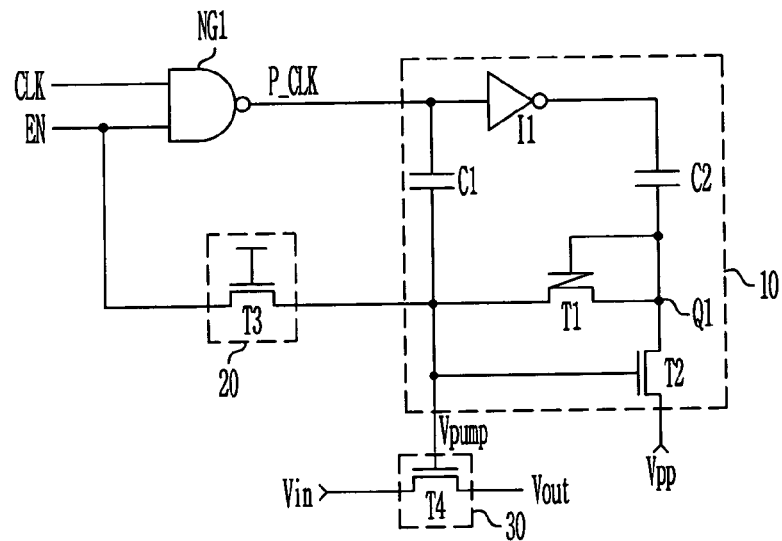
FIG. 1 is a circuit diagram illustrating a conventional high voltage switch circuit.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 2:
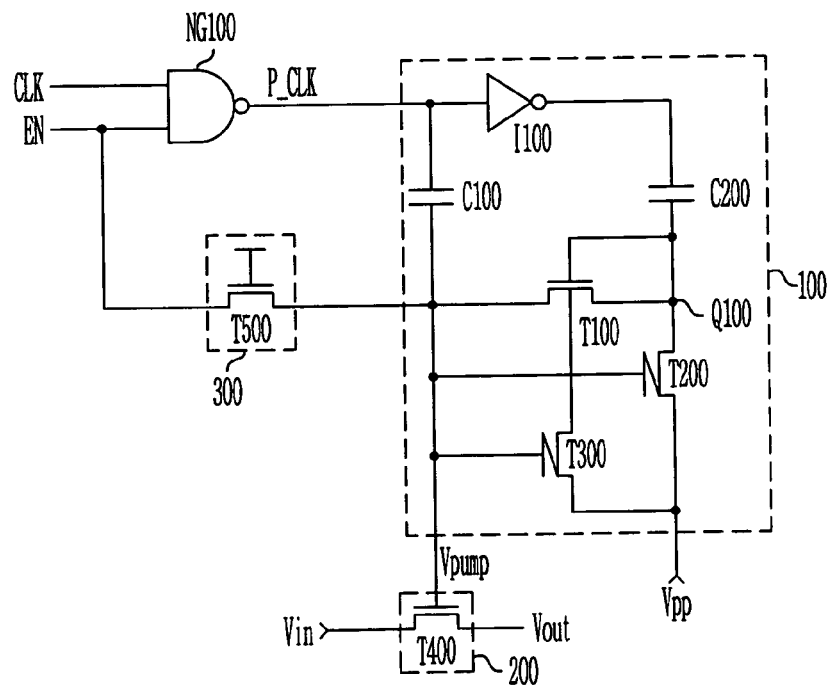
FIG. 2 is a circuit diagram illustrating a high voltage switch circuit of a semiconductor device in accordance with the present invention.

FIG. 2 is a circuit diagram illustrating a high voltage switch circuit of a semiconductor device in accordance with the present invention.

As illustrated in FIG. 2, the high voltage switch circuit includes a NAND gate NG100 for outputting a pumping clock signal P_CLK according to logic combinations of an external clock signal CLK and enable signal EN, a pumping unit 100 having native transistors T200 and T300 for reducing back bias effects and a transistor T100 formed on a well, wherein the well is preferably formed with a triple well, and outputting a pumping voltage Vpump according to an external first high voltage Vpp and the pumping clock signal P_CLK, a switch unit 200 for switching a second high voltage Vin according to the pumping voltage Vpump, and a precharge unit 300 for precharging the output from the pumping unit 100 according to the enable signal EN.

The pumping unit 100 includes a first capacitor C100 for pumping a voltage of the pumping clock signal P_CLK to the output from the pumping unit 100, an inverter I100 for inverting the pumping clock signal P_CLK, a second capacitor C200 for pumping a voltage of the inverted pumping clock signal to a first node Q100, the first transistor T100 having a triple well for supplying a voltage of the first node Q100 to an output terminal of the pumping unit 100 according to a voltage level of the first node Q100, the first native transistor T200 for transmitting the first high voltage Vpp to the first node Q100 according to the output of the pumping unit 100, and the second native transistor T300 for transmitting the first high voltage Vpp to a bulk of the first transistor T100 according to the output terminal of the pumping unit 100.

The switch unit 200 includes a second transistor T400 for transmitting the second high voltage Vin according to the pumping voltage Vpump. The precharge unit 300 includes a third transistor T500 for precharging the output terminal of the pumping unit 100 with a voltage of the enable signal EN according to a power voltage Vcc.

In this embodiment, the second native transistor T200 is used to prevent a threshold voltage increase of the transistor due to the back bias, an LVN transistor having a triple well is used as the first transistor T100, and the second native transistor T300 is used to increase a bulk bias of the first transistor T100. Therefore, a high voltage can be efficiently switched even in a low voltage (below about 2.5V). Here, the first transistor T100 and the first native transistor T200 compose a positive feedback loop, so that a high voltage can be efficiently switched in a low voltage below about 1.4V in accordance with the present invention.

The operation of the high voltage switch circuit in accordance with the preferred embodiment of the present invention will now be described.

When the enable signal EN has a logic high level, the output from the pumping unit 100 is precharged by the third transistor T500, and a state of the pumping clock signal P_CLK is varied by the clock signal CLK. The output from the pumping unit 100 increases according to the varied voltage level of the pumping clock signal P_CLK, and a voltage level of the first node Q100 increases as much as the output voltage level increase of the pumping unit 100. When the pumping clock signal P_CLK is varied again, the output voltage level of the pumping unit 100 increases again through loss of the threshold voltage of the first transistor T100.

The output (pumping voltage) of the pumping unit 100 has the same voltage level as the second high voltage Vin by the positive feedback operation. The second high voltage Vin can be efficiently switched by using the pumping voltage Vpump as a gate voltage of the second transistor T400. That is, when the pumping voltage Vpump is over Vin+Vt(T400), the second high voltage Vin can be supplied to Vout without any loss. Here, the second high voltage Vin implies a voltage over about 20V.

In addition, loss of the threshold voltage of the first transistor T100 is minimized by the second native transistor T300, thereby preventing reduction of the pumping voltage Vpump. When a difference between the gate voltage and the bulk voltage increases, the threshold voltage increases. It can be solved by supplying the voltage having the same level as the gate voltage of the first transistor T100 to the bulk of the first transistor T100 through the second native transistor T300.

As discussed earlier, in accordance with the present invention, a high voltage over about 20V required in a flash memory can be efficiently switched even in a low voltage below about 1.4V by reducing increase of the threshold voltage by the back bias.

Furthermore, a low voltage memory device can be developed and an area of a pumping capacitor can be reduced by using the high voltage switch circuit of the invention.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A high voltage switch circuit of a semiconductor device, comprising:
    an input unit for outputting a pumping clock signal by logically combining a clock signal and an enable signal;
    a pumping unit for outputting a pumping voltage by a pumping operation using the pumping clock signal received from the input unit, wherein the pumping unit includes;
    a first capacitor for increasing an output voltage of the pumping unit in response to the pumping clock signal so that the pumping voltage is outputted;
    an inverter for inverting the pumping clock signal;
    a second capacitor for increasing a voltage of a first node in response to an output of the inverter; and
    a LVN transistor for connecting an output terminal of the pumping unit with the first node according to a voltage level of the first node;
    a first native transistor connected between the first node and a high power supply terminal and its gate is connected to the output terminal of the pumping unit;
    a second native transistor connected between the first node and a well on which the LVN transistor is formed and its gate is connected to the output terminal of the pumping unit; and
    a switch unit for switching a second high voltage according to the pumping voltage.

2. The high voltage switch circuit as recited in claim 1, wherein
    the first capacitor is connected between an output terminal of the input unit and an output terminal of the pumping unit,
    the inverter is connected to the output terminal of the input unit,
    the second capacitor is connected between an output terminal of the inverter and the first node, and
    the LVN transistor is connected between the first node and the output terminal of the pumping unit.

3. The high voltage switch circuit as recited in claim 1, further comprising a second transistor for precharging the output terminal of the pumping unit according to the enable signal.

4. The high voltage switch circuit as recited in claim 1, wherein the switch unit includes a third transistor.

5. The high voltage switch circuit as recited in claim 1, wherein the input unit includes a NAND receiving the enable signal and the clock signal and outputting the pumping clock signal.

* * * * *